United States Patent
Guenin et al.

(10) Patent No.: US 9,003,636 B2
(45) Date of Patent: Apr. 14, 2015

(54) METHOD OF MANUFACTURING A CONTROL INTERFACE FOR MOTOR VEHICLE

(75) Inventors: Gérard Guenin, Villeneuve le Comte (FR); Frédéric Autran, Paris (FR); Henry Beraud, Vincennes (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 319 days.

(21) Appl. No.: 13/703,152

(22) PCT Filed: Jun. 10, 2011

(86) PCT No.: PCT/FR2011/000343
§ 371 (c)(1),
(2), (4) Date: Mar. 11, 2013

(87) PCT Pub. No.: WO2011/154627
PCT Pub. Date: Dec. 15, 2011

(65) Prior Publication Data
US 2013/0174415 A1    Jul. 11, 2013

(30) Foreign Application Priority Data
Jun. 10, 2010 (FR) ...................... 10 02454

(51) Int. Cl.
*H01S 4/00* (2006.01)
*H05K 13/00* (2006.01)
*B29C 45/14* (2006.01)
*H05K 5/00* (2006.01)

(52) U.S. Cl.
CPC .......... *H05K 13/00* (2013.01); *B29C 45/14065* (2013.01); *B29C 45/14467* (2013.01); *B29C 2045/14114* (2013.01); *H05K 5/0017* (2013.01)

(58) Field of Classification Search
USPC .......................... 29/592.1, 825, 852; 455/566
See application file for complete search history.

(56) References Cited

U.S. PATENT DOCUMENTS 7,792,558 B2 *  9/2010  Bang et al. ................. 455/575.4
8,280,446 B2 * 10/2012  Hong et al. ................... 455/566

FOREIGN PATENT DOCUMENTS

EP    2 066 162 A1    6/2009
JP    10-100243 A     4/1998

OTHER PUBLICATIONS

International Search Report issued in PCT/FR2011/000343 mailed Aug. 25, 2011 (4 pages).

* cited by examiner

*Primary Examiner* — Carl Arbes
(74) *Attorney, Agent, or Firm* — Osha Liang LLP

(57) ABSTRACT

The present invention relates to a method of manufacturing a control interface for motor vehicle comprising a touch pad exhibiting a front face, and a housing accommodating said touch pad, said housing exhibiting an aperture delimited by a border for access to the front face of the touch pad by a user, characterized in that: —in the course of a first step (101), the aperture of a housing is disposed around a touch pad provided with a film on the front face, the film covering at least the front face of the touch pad and the edges of the housing, —in the course of a second step (102), a holding force is applied to the housing so as to hold it, and —in the course of a third step (103), a liquid levelling lining material is introduced into a peripheral space partitioned off by the film, the border of the housing and the rim ate touch pad, so as to spread the liquid levelling lining material in said peripheral space.

8 Claims, 1 Drawing Sheet

METHOD OF MANUFACTURING A CONTROL INTERFACE FOR MOTOR VEHICLE

Figure 1:
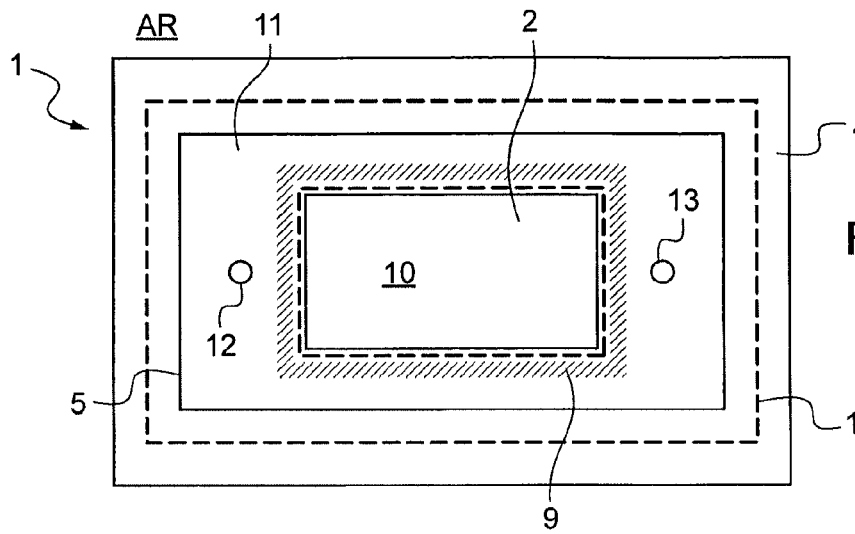

The present invention relates to a method of manufacturing a control interface for a motor vehicle. More specifically, such an interface finds an advantageous application in controls located near the driver, on the instrument panel or front console of a motor vehicle, for example to control functions of an air conditioning system, an audio system, a telephone system, a multimedia system or even a navigation system.

Motor vehicle control and display devices comprise a display screen for displaying information or control data. These screens may be covered by a transparent touch-sensitive tile allowing the users of the vehicle to input commands. The touch-sensitive tile makes it possible to determine the coordinates of where a user is pressing with a finger, for example using resistive or capacitive technologies.

Touch-sensitive tiles are thin, fragile components revealing salient edges that need to be protected and concealed. To do that, protective surrounds are fitted all around the touch-sensitive tiles, forming a raised shoulder. The display screen therefore has a recessed appearance.

The desire nowadays is to make vehicle facades more ergonomic for the user by offering control interfaces of smooth appearance and uniform touch.

The invention proposes a simplified method of manufacturing a control interface for a motor vehicle making it possible to obtain an interface facade of smooth appearance with a uniform touch.

To this end, one subject of the present invention is a method of manufacturing a control interface for a motor vehicle comprising a touch-sensitive tile having a front face and a casing housing said touch-sensitive tile, said casing having an opening delimited by a border so that a user can access the front face of the touch-sensitive tile, characterized in that:

during a first step, the opening of the casing is positioned around the touch-sensitive tile provided with a film on the front face, the film covering at least the front face of the touch-sensitive tile and the edges of the casing, during a second step, a retaining force is applied to the casing to hold it in position, and during a third step, the liquid leveling compound is introduced into a peripheral space stopped off by the film, the border of the casing and the edge face of the touch-sensitive tile, so that the liquid leveling compound can be spread out in said peripheral space.

A liquid compound is used so that it can be introduced through the casing into a peripheral space formed between the film at the front, the border of the casing and the edge face of the touch-sensitive tile. Once it has polymerized, the liquid leveling compound hardens, thus leveling the front face of the touch-sensitive tile with the edges of the casing.

The film, which is needed to protect and to decorate the facade, also acts as a barrier to the leveling compound at the front face, thus avoiding the need to use a mold which would have required a number of additional steps during the manufacturing process, including a step of cleaning the leveling compound at the front face using mold release agents and a laminating step for unlaminating the film and subsequently pressing it down firmly on the facade of the interface. In this way, the method is simple because it requires just one operation of introducing the liquid compound.

According to one specific embodiment of the method of manufacturing:

during said first step, a seal is interposed between the rear face of the touch-sensitive tile and a retaining projection of the casing, during said second step, a force is also applied to the retaining projection to compress the seal between the rear face of the touch-sensitive tile and the retaining projection, and during said third step, the liquid leveling compound is introduced into said peripheral space stopped off by the film, the border and the retaining projection of the casing, the seal and the edge face of the touch-sensitive tile.

Any seepage of leveling compound is thus stopped by the seal which prevents it from contaminating the rear face of the touch-sensitive tile.

According to one or more features of the production method taken on its own or as a combination:

during the second step, the seal is compressed with a compression ratio of between 5% and 40%, the leveling compound contains an adhesive that hardens following exposure to ultraviolet radiation, the leveling compound contains a silicon, the leveling compound contains a polyurethane adhesive, the leveling compound is introduced by injection at a pressure of less than 5 bar, the leveling compound is introduced by pouring under gravity.

Figure 2A:
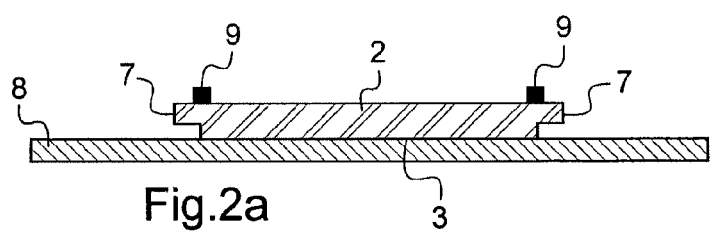
Figure 3:
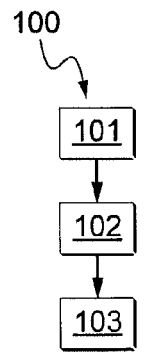
Figure 2B:
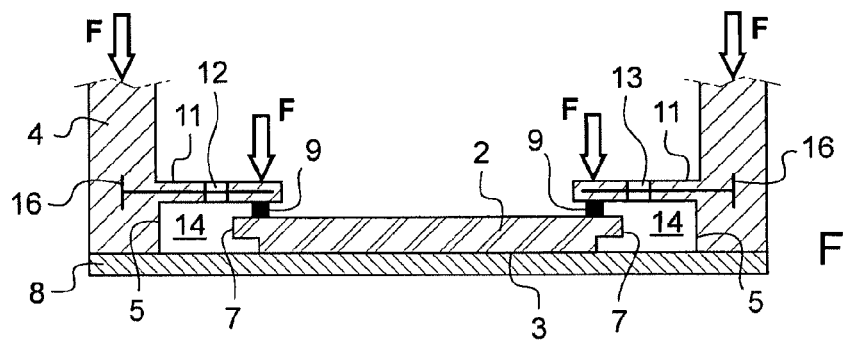
Figure 2C:
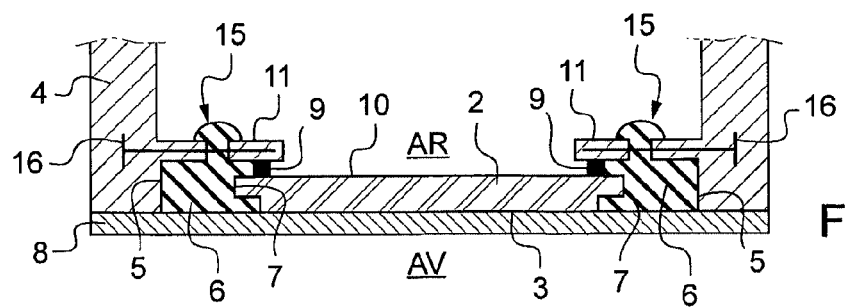

Other features and advantages of the invention will become apparent from the following description, given by way of nonlimiting example, with reference to the attached drawings in which:

FIG. 1 is a schematic rear view of a control interface, in which figure elements of the interface are depicted in dotted line, FIG. 2a is a side view in cross section of a touch-sensitive tile provided with a film and with a seal, of the control interface of FIG. 1, FIG. 2b is a view similar to FIG. 2a during a second step of the method of manufacturing a control interface, FIG. 2c is a view similar to FIG. 2a, during a third step of said method of manufacture, and FIG. 3 is a flow chart of the various steps of the method of manufacturing a control interface.

In these figures, the identical elements bear the same reference numerals.

FIG. 1 depicts a schematic rear view of a control interface 1 for a motor vehicle. The interface 1 may be fixed near to a user, for example on the central console of the vehicle or on the instrument panel (not depicted) in order for example to control functions of air conditioning, of an audio system, of a telephone system, of a multimedia system, or even of a navigation system.

The interface 1 comprises a touch-sensitive tile 2 having a front face 3 (see FIG. 2b), which means a face facing toward the user for inputting commands, a casing 4 housing the touch-sensitive tile 2, said casing 4 having an opening delimited by a border 5 at least in line with the front face 3 of the touch-sensitive tile so as to allow a user to access same, and a leveling compound 6 (see FIG. 2c), interposed between the edge face 7 of the touch-sensitive tile 2 and the border 5 of the casing 4.

The interface 1 also comprises a display screen (not depicted) for displaying information or control data, such as a TFT screen (which uses thin film transistor technology).

The touch-sensitive tile 2 is superposed on the screen and comprises a resistive sensor or a capacitive sensor, the one or the other being at least partially transparent, so that a user can input commands. In the case of a resistive sensor, the latter comprises a main panel and a secondary panel, these two panels being made of glass, the secondary panel being thinner than the main panel. The secondary panel has the function of deforming under a pressure force applied by the finger of the user while the main panel is less deformable, its thickness being such that it does not flex under the effect of pressure applied by the finger of a user. The sensor is thus able to detect the position of the finger of the user using a network of conductors placed between the main panel and the secondary panel, in an arrangement that is, for example, horizontal and vertical. The touch-sensitive tile 2 is electrically connected to an electronic board by means of a multiconductor flex, the electronic board interpreting the detection made by the touch-sensitive tile 2.

As visible in FIG. 2c, the leveling compound 6 is peripheral to the edge face 7 of the touch-sensitive tile 2, to level the front face 3 of the touch-sensitive tile 2 with the edges of the casing 4. Thus, the leveling compound 6 levels the touch-sensitive tile 2 with the casing 4 so that the user perceives only a smooth surface that is uniform to the touch, with no roughnesses or bumps, a finger sliding across the boundary between the touch-sensitive tile 2 and the casing 4 without this boundary being perceptible and which boundary can also be rendered invisible through a suitable choice of colors used, giving the impression of a continuous surface.

Use is made of a liquid leveling compound so that it can be introduced through the casing 4 into a peripheral space 14 formed between the film at the front, the border of the casing 4, the seal 9 and the edge face 7 of the touch-sensitive tile 2. After polymerization, the liquid leveling compound 6 hardens, thus leveling the front face of the touch-sensitive tile 2 with the edges of the casing 4.

The interface 1 comprises a film 8 on its front facade. The film 8 covers the front face 3 of the touch-sensitive tile 2 accessible to the user (or control surface), the leveling compound 6 and the edges of the casing 4, the dimensions of the film 8 and the dimensions of the interface 1 being similar, or even identical.

The film 8 has one or more of the following features including: decoration, anti-scratch properties, anti-reflection and diffusing properties, the latter giving the interface a matt appearance and preventing reflective effects that the user finds troublesome, the anti-reflection property preventing any incident light from re-emerging from the surface, diffusion properties scattering the incident light in all directions and/or polarizing properties, i.e. properties likely to bar light reflected by the glass panels of the touch-sensitive tile in a given direction.

The interface 1 may comprise a seal 9 (FIG. 2b), interposed between a rear face 10 of the touch-sensitive tile 2 and a retaining projection 11 of the casing 4, the seal 9 bordering the leveling compound 6 between the rear face 10 of the touch-sensitive tile 2 and the retaining projection 11.

During the introduction of the liquid leveling compound 6, any seepage of leveling compound 6 is stopped by the seal 9, preventing it from contaminating the rear face 10 of the touch-sensitive tile 2. In that way, the necessary assembly clearances between the casing 4 and the touch-sensitive tile 2 can be provided in the normal way without detracting from the sealing of the interface 1. Likewise, liquid compounds can be chosen from the most fluid compounds in order best to fill the gaps there are between the border of the casing 4 and the edge face 7 of the touch-sensitive tile 2 without the risk of leaks during the filling of the peripheral space 14 with the liquid leveling compound 6. Seepages in zones of the touch-sensitive tile and which could detract from the esthetic and functional appearance of the interface are thus avoided.

Aside from its function of filling shortcomings in the planarity of the front facade of the interface 1, the leveling compound 6 adheres to the film 8 via their common surfaces. The leveling compound 6 also holds the touch-sensitive tile 2 to the casing 4 while at the same time retaining a certain degree of flexibility in order to absorb any loadings on the casing 4 and protects and guides the multiconductor flex which is partially embedded in the leveling compound 6 from vibrations of the motor vehicle or sharp edges of the touch-sensitive tile 2.

For that, a material is chosen that can be injected/poured at low pressure and low temperature, such as an elastomer, such as an EPDM (ethylene propylene diene monomer), a TPE (a thermoplastic elastomer, such as an SEBS (styrene-ethylene-butylene-styrene), SBS (styrene-butadiene-styrene) or TPU (thermoplastic polyurethane) material) or a silicone elastomer. The choice of leveling compound 6 may also lean toward a material that has better fluidity so that it better fills the gaps, and that also has properties of adhesiveness and flexibility, such as a silicone or a glue which hardens following exposure to ultraviolet radiation (or UV glue) or polyurethane glue. When the leveling compound material is polymerized or crosslinked, by heating or after a drying time (silicone) or after exposure to ultraviolet radiation (UV glue), these materials become more rigid, giving an appearance that is smooth to the touch.

The seal 9 for example comprises a foam. The foam 9 allows a modest pressure to be applied to the touch-sensitive tile 2, preventing loadings from being applied to it that could be interpreted as commands and that could detract from its normal operation. Further, once the liquid leveling compound 6 has hardened and the retaining force applied to the casing 4 has been released, the foam seal 9 no longer applies any loading to the touch-sensitive tile 2, which therefore presents a smooth and uniform appearance. The seal 9 does, however, maintain a function of sealing against any potential contaminants that could originate from the leveling compound 6, such as degassing from a silicone that could impair the visibility through the touch-sensitive tile 2.

The foam of the seal 9 is a closed-cell foam. The closed cells make it possible to guarantee sealing against the material of the compound. The closed-cell foam is, for example, made of polyethylene. The foam of the seal 9 may also be made of a silicone or of a rubber.

According to another example, the seal 9 is molded or a lip seal (not depicted).

The seal 9 may comprise an adhesion means to make it easier to position it on the touch-sensitive tile 2. For example, the seal 9 is fixed to the touch-sensitive tile 2 by a double-sided adhesive.

The retaining projection 11 has the form of a surround extending from the border 5 of the casing 4 toward the center of the opening. It is also possible to plan for the retaining projection 11 to be bent over at its free end to form an interior shoulder thus holding the seal 9 notably when the retaining force F is applied to the casing 4 (not depicted).

At least one injection orifice 12 and at least one corresponding vent hole 13 (FIGS. 1 and 2b) are formed in the retaining projection 11 respectively for introducing liquid leveling compound 6 and for discharging air. The air present in the peripheral space 14 of the touch-sensitive tile 2 is expelled by the arrival of the liquid leveling compound 6 and escapes via the vent hole 13, allowing the compound material to spread out correctly into all the gaps of the peripheral space 14. Surplus leveling compound can flow into the zones 15 near the injection orifice 12 or near the vent hole 13 without overspilling onto the active surfaces of the touch-sensitive tile 2 which are situated remotely, and therefore without contaminating same.

For better homogeneity of the leveling compound 6, the injection orifice 12 and the vent hole 13 may be positioned on opposite faces of the surround.

The casing 4 of the interface 1 may comprise at least one strengthening means 16. The strengthening means 16 is of particular usefulness when the casing 4 is made of plastic and the touch-sensitive tile 2 comprises glass panels. This is because since the thermal expansion coefficients are different and different by a wide margin, the strengthening means 16 strengthens the casing 4 to prevent clearances, openings or cracks from appearing at the periphery of the touch-sensitive tile 2 or to prevent shearing of the leveling compound 6. The strengthening means 16 is a structural element which forms part of or is integral with the casing 4. The strengthening means for example takes the form of a surround, inserted into the retaining projection 11 of the casing 4. It may be overmolded on or completely embedded in the casing 4. The strengthening means 16 is able to enhance the mechanical strength of the casing 4 so that the latter expands in the same way as the touch-sensitive tile 2, when the two of them are subjected to wide temperature variations. For example, the strengthening means 16 is made of metal, such as of steel, giving the casing 4 the mechanical strength it needs to withstand the thermal and mechanical stresses present in a motor vehicle passenger compartment (between −40° C. and +105° C.).

The various steps of the method of manufacture 100 illustrated by FIGS. 2a, 2b and 2c and 3 will now be described in greater detail.

The front face 3 of the touch-sensitive tile 2 is provided beforehand with a film 8, for example a film that has already been coated with glue and protrudes on each side of said front face 3. A seal 9 may be positioned, for example using adhesion, on the rear face 10 of the touch-sensitive tile 2 (FIG. 2a).

During a first step 101, the casing 4 is placed around the touch-sensitive tile 2, with the opening of the casing 4 centered on the touch-sensitive tile 2, the film 8 thus covering at least the front face 3 of the touch-sensitive tile 2 and the edges of the casing 4, the seal 9 being, if appropriate, interposed between the rear face 10 of the touch-sensitive tile 2 and a retaining projection 11 of the casing 4 (FIG. 2b).

During a second step 102, a retaining force F is applied (see arrows in FIG. 2b) to the casing 4 to hold it in position. If appropriate, a retaining force F is also applied to the retaining projection 11 to compress the seal 9 against the rear face 10 of the touch-sensitive tile 2. The retaining force F is applied by tooling suited to applying light pressure. For example, the seal 9 is compressed with a compression ratio of between 5% and 40%. Thus, with a minimum ratio of 5%, the seal is certain to be compressed by a minimum amount to ensure good sealing and with a maximum ratio of 40%, it is possible to avoid applying to the film excessive forces that could deform it.

During a third step 103, the liquid leveling compound 6 is introduced via the injection orifice 12 of the retaining projection 11 which orifice opens into a peripheral space 14 stopped off by the film 8, the border 5 and the retaining projection 11 of the casing 4, the seal 9 and the edge face 7 of the touch-sensitive tile 2, so that the compound can spread out in said peripheral space 14. The film 8 then acts as a front stop for the leveling compound 6. The liquid leveling compound 6 is introduced by gravity pouring or by injection. The injection is performed at low pressure (<5 bar) and facilitates the flow of liquid leveling compound into the peripheral space that is to be filled of the order of a few tenths.

The film 8, which is needed for protecting and/or for decorating the facade, acts as a barrier to the leveling compound 6, forming a stopping-off means at the front, thus avoiding the need to use a mold which would have required several additional steps during manufacture, including a step of cleaning the leveling compound using mold release agents and a laminating step for unlaminating the film 8 and subsequently pressing it down firmly onto the facade of the interface 1. Likewise, the seal 9 acts as an internal stop for the leveling compound 6 and notably avoids subsequent steps of cleaning inside the casing. Thus the method is simple because it requires just one single operation of introducing the liquid leveling compound 6. Its quality is improved with respect to the earlier manufacturing methods because this method limits the risks of flash on the surfaces of the touch-sensitive tile 2. Further, the surface obtained at the facade of the interface is certain to be smooth when the retaining force F applied to the seal 9 is removed.

After polymerization, the liquid leveling compound 6 hardens. Polymerization can be accelerated by heating or by exposure to ultraviolet radiation depending on the type of material chosen for the leveling compound 6.

The invention claimed is:

1. A method of manufacturing a control interface for a motor vehicle comprising a touch-sensitive tile having a front face and a casing housing said touch-sensitive tile, said casing having an opening delimited by a border so that a user can access the front face of the touch-sensitive tile, the method comprising:
   during a first step, the opening of the casing is positioned around the touch-sensitive tile provided with a film on the front face, the film covering at least the front face of the touch-sensitive tile and the edges of the casing,
   during a second step, a retaining force is applied to the casing to hold it in position, and
   during a third step, the liquid leveling compound is introduced into a peripheral space stopped off by the film, the border of the casing and the edge face of the touch-sensitive tile, so that the liquid leveling compound can be spread out in said peripheral space.

2. The method of manufacture according to claim 1, further comprising:
   during said first step, a seal is interposed between the rear face of the touch-sensitive tile and a retaining projection of the casing,
   during said second step, a retaining force is also applied to said retaining projection to compress the seal between the rear face of the touch-sensitive tile and the retaining projection of the casing,
   during said third step, the liquid leveling compound is introduced into said peripheral space stopped off by the film, the border and the retaining projection of the casing, the seal and the edge face of the touch-sensitive tile.

3. The method of manufacture according to claim 2, wherein, during said second step, the seal is compressed with a compression ratio of between 5% and 40%.

4. The method of manufacture according to claim 1, wherein the leveling compound contains an adhesive that hardens following exposure to ultraviolet radiation.

5. The method of manufacture according to claim 1, wherein the leveling compound contains a silicone.

6. The method of manufacture according to claim 1 the leveling compound contains a polyurethane adhesive.

7. The method of manufacture according to one claim 1, wherein the leveling compound is introduced by injection at a pressure of less than 5 bar.

8. The method of manufacture according to claim 1, wherein the leveling compound is introduced by pouring under gravity.

\* \* \* \* \*